United States Patent [19]

Davies et al.

[11] 4,190,683

[45] Feb. 26, 1980

[54] METHOD FOR FORMING A LIQUID PHASE EPITAXIAL FILM ON A WAFER

[75] Inventors: John E. Davies, San Francisco; Guido Galli, Saratoga, both of Calif.

[73] Assignee: International Business Machines Corporation, Armonk, N.Y.

[21] Appl. No.: 937,243

[22] Filed: Aug. 28, 1978

[51] Int. Cl.² ............................................. H01F 10/02
[52] U.S. Cl. ..................................... 427/130; 427/128
[58] Field of Search ................................ 427/127–132, 427/48, 346; 428/900

[56] References Cited

U.S. PATENT DOCUMENTS

| | | | |
|---|---|---|---|
| 2,913,246 | 11/1959 | Hagopian | 118/52 |
| 3,198,657 | 8/1965 | Kimball et al. | 117/101 |
| 3,486,937 | 12/1969 | Linares | 156/122 |
| 3,705,048 | 12/1972 | Staunton | 117/3 |
| 3,730,760 | 5/1973 | Machmiller | 117/101 |

*Primary Examiner*—Bernard D. Pianalto

*Attorney, Agent, or Firm*—Joseph E. Kieninger

[57] ABSTRACT

A method of forming an improved liquid phase epitaxial film on a wafer. The resultant film has improved uniformity of magnetic properties, such as the collapse field ($H_o$), across the surface of the wafer as well as being substantially free of mesa defects on the surface. The method includes the step of growing the liquid phase epitaxial film while the wafer is in the horizontal plane. The wafer is removed from the melt while the wafer is tilted at an angle from the horizontal plane so that the melt may drain from the wafer. Then the wafer is positioned in a horizontal plane again and rotated to remove the remaining melt droplets from the edge of the wafer. In a preferred embodiment, a plurality of wafers are positioned in a wafer holding means so that the wafers are arranged in a stacked manner having substantially the same space between adjacent wafers. Wafers may also be stacked in pairs that are back-to-back while carrying out this method.

4 Claims, 3 Drawing Figures

METHOD FOR FORMING A LIQUID PHASE EPITAXIAL FILM ON A WAFER

TECHNICAL FIELD

This invention relates to liquid phase epitaxial films and more particularly to an improved method of forming a liquid phase epitaxial film on a wafer.

It is a primary object of this invention to provide an improved method of forming a liquid phase epitaxial film on a wafer.

It is a further object of this invention to provide a method of forming a liquid phase epitaxial film having a small number of mesa defects on the surface.

It is another object of this invention to provide a method of forming a liquid phase epitaxial film that has uniform magnetic properties across the surface of the wafer.

It is still another object of this invention to provide a method of forming a liquid phase epitaxial film on a plurality of wafers during the same operation.

DESCRIPTION OF THE PRIOR ART

Magnetic bubble domain devices have a magnetic garnet film, for example, EuYGaFe garnet on a non-magnetic garnet substrate, for example, $Gd_3Ga_5O_{12}$ (GGG). These films are formed by a standard liquid phase epitaxial (LPE) method. Typically, when growing a film on a single wafer by this method, the wafer is immersed in a liquid melt and positioned horizontally while the film grows. After the film growth has been completed, the wafer is removed while maintaining it in a horizontal position. The wafer is then rotated to spin off the excess melt while maintaining its horizontal position.

Another LPE approach is described in the IBM Technical Disclosure Bulletin Vol. 16, No. 9, Feb. 1974, on page 3049. With this approach, a film is grown on a single wafer in a melt while the wafer is positioned in a horizontal plane. Then the LPE growth furnace and the dipping apparatus is tilted 5° away from the vertical line so that the substrate parts from the melt surface at an angle of about 5°. The wafer is then removed from the melt and subsequently rotated while positioned at the 5° angle.

The two processes described above have a limited output since only one film is grown on a single wafer at one time. In order to increase the output a large amount of work has been done to extend the methods used for growing an LPE film on a single wafer to find a method suitable for growing a film on a plurality of wafers, for example, 5 or 10 wafers at a time.

One such process for growing films on a plurality of wafers is the simple extension of the first method previously described. In this no tilt process a plurality of wafers are stacked horizontally in a wafer holding menas so that the spacing between the wafers is substantially the same. The wafers are immersed in the melt and held in a horizontal position during the film growth, removed from the melt in a horizontal position, and then rotated to remove the excess melt while in a horizontal position. These films tended to have uniform magnetic properties such as the collapse field, ($H_0$), the bubble collapse field, across the wafer. On the other hand, however, this no tilt method yields wafers which have a number of defects in the surface in the form of mesas. It is desirable to have as few mesa defects as possible. A mesa is a raised area on the wafer that occurs when a liquid droplet is not removed.

This no tilt method can also be used with pairs of wafers back-to-back in order to increase the throughput. However, it has been found that the film on the bottom wafer of each wafer pair has substantially more surface defects on it than the film on the top wafer.

Another LPE approach for the growing of films on a plurality of single wafers yields films having a reduced number of mesa defects. This method involves placing a plurality of single wafers in a wafer holding means so that the wafers are positioned in a spaced-stacked relationship and held at a fixed angle, for example, at 5° throughout the process. The film is grown while the wafers are tilted, the wafer is removed from the melt while tilted, and the wafers are subsequently rotated to spin off the excess melt while tilted. While this fixed tilt method does produce a film having a reduced number of mesa defects on the surface, the uniformity of the magnetic properties, that is, $H_0$, varies across a wafer. It has been reported in technical papers that the uniformity of $H_0$ decreases substantially as the tilt angle exceeds 5°.

This fixed tilt method can also be used with pairs of wafers back-to-back in order to increase the throughput. However, it has been found that the film on the bottom wafer of each wafer pair has substantially more surface defects on it than the film on the top wafer.

DISCLOSURE OF THE INVENTION

For a further understanding of the invention, and the objects and advantages thereof, reference will be had to the following description and the accompanying drawings, and to the appended claims in which the various novel features of the invention are more particularly set forth.

Accordingly, a method of forming an improved LPE film on a wafer is described. The resultant film has improved uniformity of magnetic properties, for example, $H_0$, across the surface of the wafer as well as being substantially free of mesa defects on the surface. The method includes the step of growing the liquid phase epitaxial film while the wafer is in the horizontal plane. The wafer is removed from the melt while the wafer is tilted at an angle from the horizontal plane so that the melt may drain from the wafer. Then the wafer is positioned in a horizontal plane again and rotated to remove the remaining melt droplets from the edge of the wafer. In a preferred embodiment, a plurality of wafers are positioned in a wafer holding means so that the wafers are arranged in a stacked manner having substantially the same space between adjacent wafers. Wafers may also be stacked in pairs that are back-to-back while carrying out this method.

BEST MODE FOR CARRYING OUT THE INVENTION

Figures 1, 2:
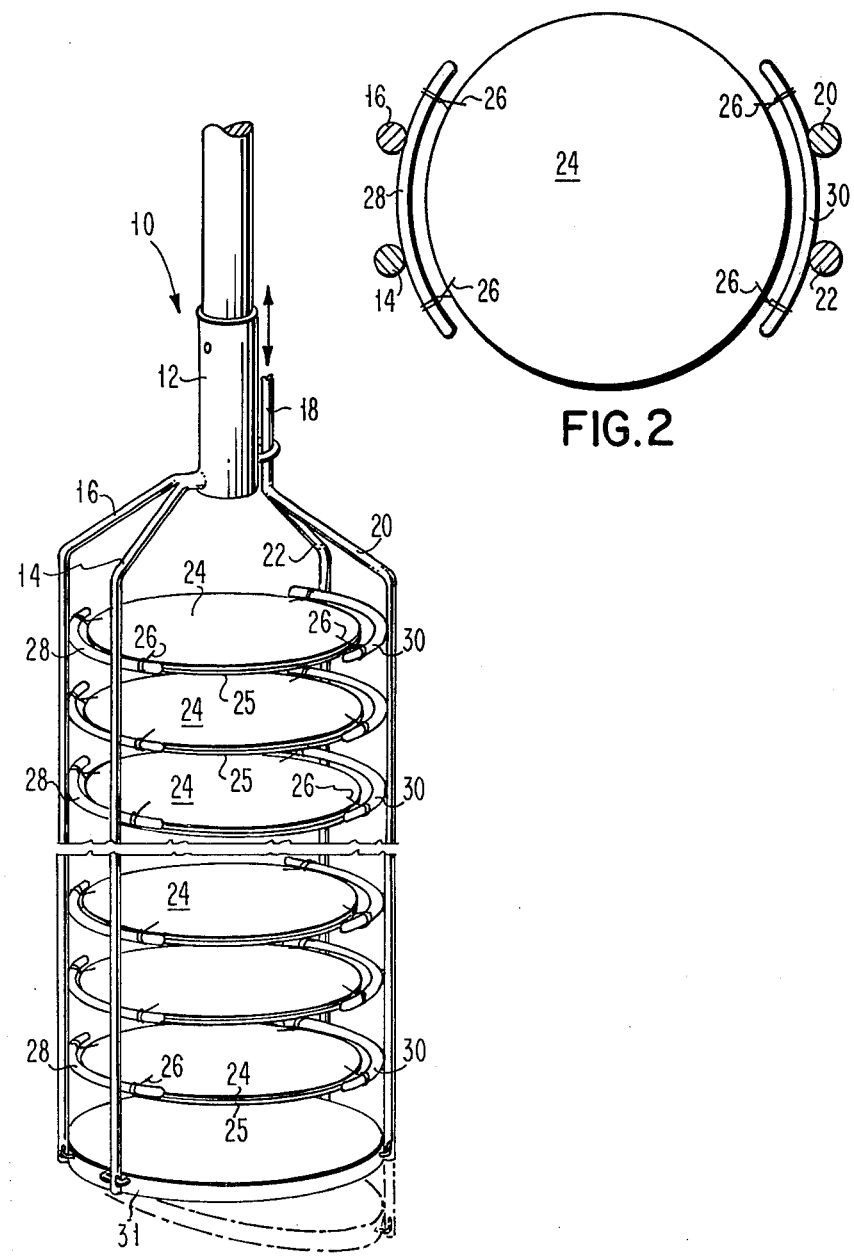
FIG. 1 is a three-dimensional view of the apparatus used in the subject method.
FIG. 2 is a top view partly in section of the apparatus shown in FIG. 1.

An apparatus suitable for performing the LPE film growth is shown in FIGS. 1 and 2 where the wafer holder 10 has a support rod 12. At the end of support rod 12 are rod extensions 14 and 16. The tilt in the wafer holder is obtained by moving adjustable rod 18 having end portions 20 and 22. A plurality of pairs of wafers 24 and 25 are held in wafer holder 10 by means of clamps 26 which are connected to end portions 14, 16, 20 and 22 by support members 28 and 30, respectively. A paddle 31 is hinged onto the end portion 14 and 20.

The invention will be described with reference to forming a film on a plurality of wafers that are stacked in pairs back-to-back. It is to be recognized that this process is also applicable to forming a film on a single wafer as well as to forming a film on a plurality of single wafers that are stacked in a spaced relationship.

After the wafer pairs are stacked and positioned firmly in spaced relationship in the wafer holder, the wafer holder is immersed into a liquid melt of the magnetic garnet film material so that all of the wafer pairs are completely immersed therein. The wafer holder may be inserted into the liquid melt while the wafer pairs in the holders are positioned in a horizontal plane. Alternatively, the wafer holder may be inserted into the liquid melt while the wafer pairs in the holder are tilted at an angle ranging from 5° to 90°.

Figure 3:
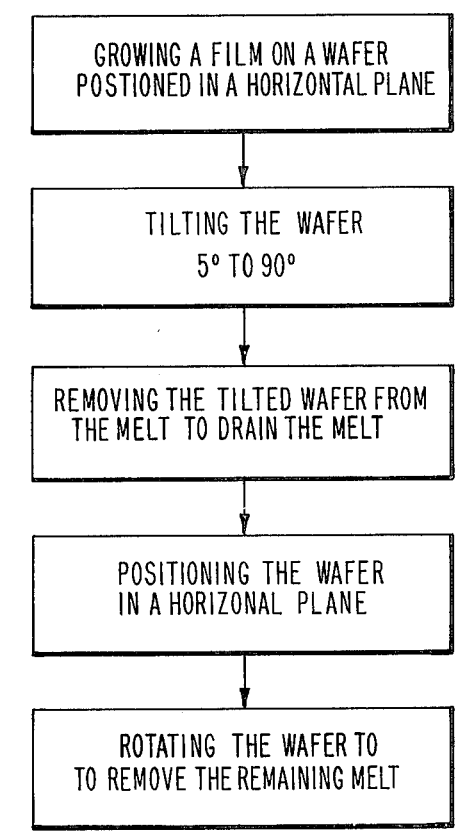
FIG. 3 is a flow diagram depicting the subject method.

As shown in the flow chart of FIG. 3, the next step is growing a film on the wafers which are positioned in a horizontal plane. It is desirable to grow the film while the wafer is in a horizontal plane in order to insure uniformity of magnetic properties, such as the collapse field, $H_0$, in the LPE film.

After the LPE film has grown to the desired thickness, the wafer holder is adjusted so that the wafers are tilting at an angle of 5° to 90° from the horizontal plane. The wafers are then removed from the melt while tilted at the angle of 5° to 90° so that the melt drains from the tilted wafers. A convenient angle to remove the wafers is from 10° to 45° with the preferred angle being from 20° to 30°. The rate of removing the wafers from the melt is about 0.1 to 0.25 cm/sec with the preferred rate being 0.1 to 0.125 cm/sec. This step is accomplished very quickly between the time that the wafers have been removed from the melt and to the time that the wafers are repositioned in a horizontal plane. As soon as the wafers are repositioned in the horizontal plane, the wafer holder is rotated at a speed sufficient to spin off the liquid melt droplets remaining on the surface of the film. The number of mesa defects on the LPE film of the bottom wafer is low enough to be acceptable while the number of defects on the LPE film of the upper wafer is very low. The uniformity of the magnetic properties of the LPE films as measured by $H_0$ is good. The spread of the $H_0$ across either LPE film of the wafer pair on a 2" wafer is low.

EXAMPLE NO. 1

Five single wafers were arranged in a stacked manner having a spacing between the wafers of about 1 cm. The two inch GGG wafers were positioned in a horizontal plane and immersed into a liquid melt of SmYLuFeCaGe garnet dissolved in a $PbO-B_2O_3$ flux. The wafers were left in the melt in a horizontal position for two minutes. The wafer holder was adjusted so that the wafers were tilted at an angle of 25° from the horizontal. The wafers were then removed from the melt while in the tilted position. The wafer holder was then adjusted so that the wafers would be in a horizontal position. The wafers were then rotated at 400 RPM for 0.5 minutes to spin off the remaining liquid melt. The wafers were checked to determine the average number of chips with mesa defects. A chip is a small area, for example, 5 mm×5 mm, on which a single complete bubble memory circuit is fabricated. On the upper surface of the wafer there was 0.7 chips with mesa defects. On the bottom film surface, there was 3.0 chips with mesa defects. The spread of the collapse field, $H_0$, across the film was 1.2 Oe.

The following table compares the quality of the films obtained by this process with the prior art process having no tilt and with a fixed tilt.

| Method | Chips w/Mesa Defects | | wafer Uniformity Change in $H_0$, Oe |
|---|---|---|---|
| | Top Surface | Bottom Surface | |
| Prior Art-No Tilt | 1.4 | 8.4 | |
| Prior Art-Fixed Tilt (5°) | 0.8 | 7.1 | 2.4 |
| Example 1 | 0.7 | 3.0 | 1.2 |

INDUSTRIAL APPLICABILITY

A number of different variations of this process may be used. One such variation is shown in Example No. 2.

EXAMPLE NO. 2

Ten wafers were arranged back-to-back so that they made a stack of five pairs of wafers each wafer pair being separated from the adjacent pair by approximately 1 cm. The same procedure set forth in Example No. 1 was used. The uniformity of the wafers, $H_0$, was 1.2 Oe for the wafers that were facing upward as well as for the wafers that were facing downward for each pair. There were 0.7 chips with mesa defects on the upper facing film surfaces and there were 3.0 chips with mesa defects on the lower facing wafer films.

While I have illustrated and described the preferred embodiments of my invention, it is understood that I do not limit myself to the precise steps herein and the right is secured to allow changes and modifications coming within the scope of the invention as defined in the appended claims.

I claim:

1. A method of forming an improved liquid phase epitaxial film on a plurality of wafers comprising the steps of:
    positioning a plurality of wafers in a wafer holding means whereby the wafers are arranged in a stacked manner and where the spacing between the wafers is substantially the same;
    inserting the wafer holding means into a liquid melt whereby the wafers are completely immersed in the liquid melt;
    growing a film on the wafers while said wafers are positioned in the wafer holder in a horizontal plane in the liquid melt;
    tilting the wafers in the wafer holder from 5° to 90°;
    removing the wafer holder from said melt while said wafers are in a tilted position to drain the melt from said wafers;
    positioning said wafers in a horizontal plane in the wafer holder; and
    rotating the wafer holder to remove the remaining melt droplets from the edges of said wafers.

2. A method as described in claim 1 whereby the wafer holder is inserted into the liquid melt while the wafers in said holder are tilted at an angle ranging from 5° to 90°.

3. A method as described in claim 1 whereby the wafer holder is inserted into the liquid melt while the wafers in said holder are positioned in a horizontal plane.

4. A method of forming an improved liquid phase epitaxial film on a plurality of wafers comprising the steps of:
- positioning a plurality of wafers in a wafer holding means whereby the wafers are stacked in pairs back-to-back and where the spacing between pairs is substantially the same;
- inserting the wafer holding means into a liquid melt whereby the wafers are completely immersed in the liquid melt;
- growing a film on the wafers while said wafers are positioned in the wafer holder in a horizontal plane in the liquid melt;
- tilting the wafers in the wafer holder from 5° to 90°;
- removing the wafer holder from said melt while said wafers are in a tilted position to drain the melt from said wafers;
- positioning said wafers in a horizontal plane in the wafer holder; and
- rotating the wafer holder to remove the remaining melt droplets from the edges of said wafers.

* * * * *